(12) United States Patent
Do et al.

(10) Patent No.: US 8,138,801 B1
(45) Date of Patent: Mar. 20, 2012

(54) FREQUENCY CROSSING DETECTION USING OPPOSING PATTERN DETECTORS

(75) Inventors: Viet Do, Carlsbad, CA (US); Simon Pang, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 66 days.

(21) Appl. No.: 12/892,723

(22) Filed: Sep. 28, 2010

Related U.S. Application Data

(63) Continuation-in-part of application No. 12/843,534, filed on Jul. 26, 2010, now Pat. No. 7,956,649.

(51) Int. Cl.
*H03D 13/00* (2006.01)
(52) U.S. Cl. ............... 327/42; 327/39; 327/47
(58) Field of Classification Search .............. 327/39–45, 327/47–49
See application file for complete search history.

(56) References Cited

U.S. PATENT DOCUMENTS

| 7,242,223 | B1 * | 7/2007 | Alon | 327/39 |
| 7,382,165 | B2 * | 6/2008 | Gonzalez et al. | 327/39 |
| 7,956,649 | B1 * | 6/2011 | Pang et al. | 327/42 |

* cited by examiner

*Primary Examiner* — Hai L Nguyen
(74) *Attorney, Agent, or Firm* — Law Office of Gerald Maliszewski; Gerald Maliszewski

(57) ABSTRACT

A system and method are provided for matching a signal (compClk) to a particular frequency band in a multiband communications device. The method accepts a compClk signal, a frequency source is selected from sources collectively covering a range of frequency bands, and a reference clock is supplied from the selected source. If the frequency of the compClk is greater than the reference clock frequency, a high frequency window sampler supplies a first frequency pattern detector output signal (fpdOut_1). Simultaneously, a low frequency window sampler compares the compClk signal with the reference clock. If the frequency of the compClk is less than the reference clock frequency, the low frequency window sampler supplies a second frequency pattern detector output signal (fpdOut_2). The selected frequency source is compared to fpdOut_1 and fpdOut_2 signals, and a determination is made as to whether the selected frequency source coarsely matches the compClk frequency.

18 Claims, 11 Drawing Sheets

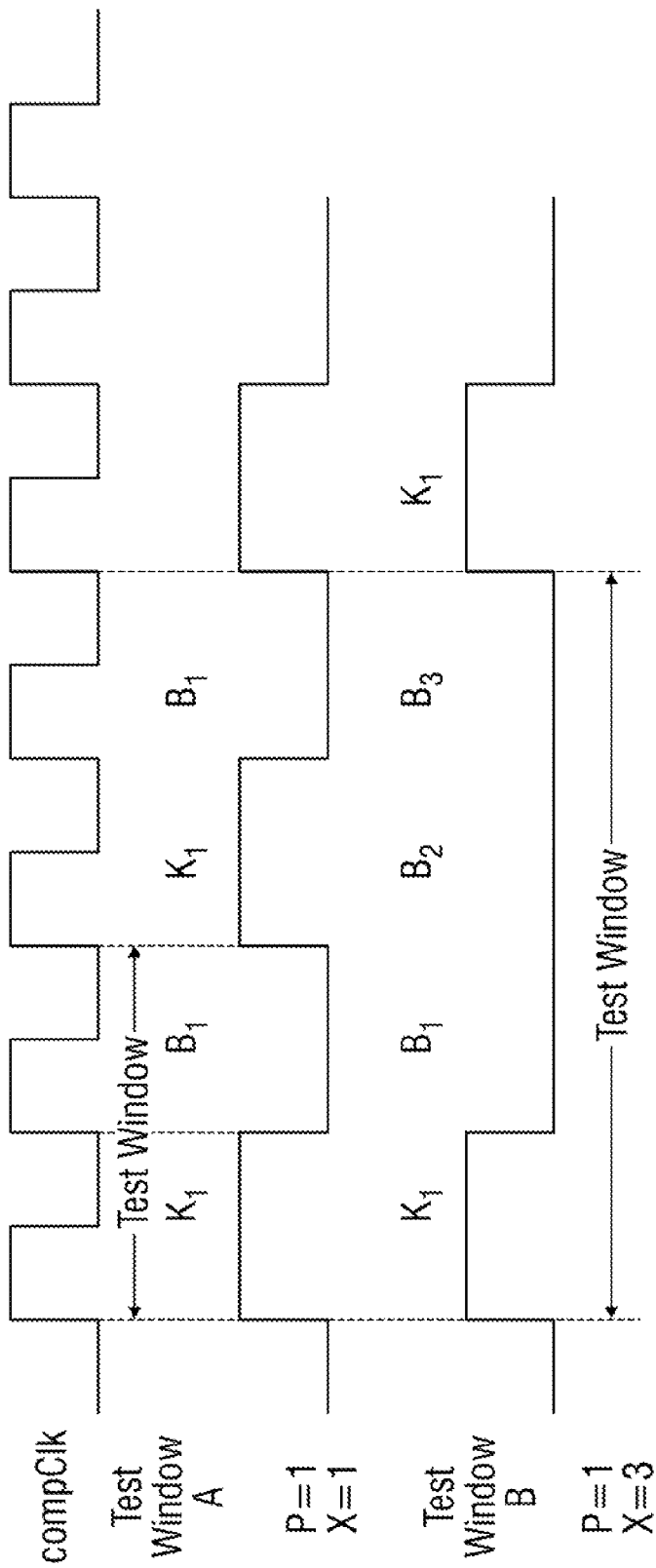

FREQUENCY CROSSING DETECTION USING OPPOSING PATTERN DETECTORS

RELATED APPLICATIONS

This application is a Continuation-in-Part of a patent application entitled, FREQUENCY PATTERN DETECTOR, invented by Simon Pang et al, Ser. No. 12/843,534, filed Jul. 26, 2010 now U.S. Pat. No. 7,956,649, which is incorporated herein by reference.

BACKGROUND OF THE INVENTION

1. Field of the Invention

This invention generally relates to phase-locked loop (PLL) circuitry and, more particularly, to a system and method for simply determining the frequency of a signal with respect to a known reference frequency.

2. Description of the Related Art

In many communication applications, the most critical process in determining device performance involves ascertaining the relationship among key frequencies. This complex process limits device performance with regard to speed of acquisition, power consumption, and integrated circuit (IC) die area.

In all PLLs, an internal oscillator is calibrated such that its frequency is exactly identical to an external reference. Modern PLLs consist of an oscillator which can be digitally calibrated. This oscillator is called a digitally calibrated oscillator (DCO). A mechanism is required to identify a digital control value that produces a DCO oscillation with frequency close to the external reference. The mechanism, called frequency band search (FBS), must be simple, such that implementation is cost competitive. Speedy convergence is also highly desirable for fast PLL lock time.

FIG. 8 is a flowchart illustrating a process for acquiring a frequency band in a multi-band communication system (prior art). The PLL is ubiquitous in communication systems. Communication devices, e.g., serializer/deserializer (SERDES) devices, that operate over a wide range of frequencies require several PLLs or DCOs.

The frequency band search begins in Step 800. In Step 802 a comparison is performed between the frequency of the reference and a divided-down oscillator frequency. The result is then analyzed in Step 804. If the reference frequency is close enough to the divided-down oscillator frequency, FBS concludes in Step 808. Otherwise, the digital control of the oscillator is adjusted in Step 810 and a comparison is performed again (Step 802). A frequency band search across a band of several oscillators can be very time consuming, especially if the communication frequency band is unknown.

FIG. 1 is a schematic block diagram of a frequency counter (prior art). When reset b is released, both counters start to accumulate. The most significant bit (MSB) of each counter rises when the corresponding clock finishes counting $2^7$ clock cycles. If the compClk is faster than refClk in frequency, compMSB rises before refMSB. The Edge Detector 100 identifies the relative time of the rising edge of compMSB and refMSB. CompFast rises if compClk is faster than refClk. However, this method requires a large number of clock cycles to make a comparison, especially if the two clocks are close in frequency. Long measurement times slow PLL frequency acquisition.

Going forward, fast lock times with large pull-in range bandwidths are going to be a required feature of modern PLL and clock and data recovery (CDR) for wired and wireless serializer/deserializer (SerDes) applications. In wired SerDes applications, the demand for multiple protocols with dynamic adaptation has pushed the fast lock requirement so that network protocol change can occur in real-time. In wireless SerDes, the demand for a new generation of data wireless networks has pushed the fast lock requirement so that data can be adapted with multiple rates.

It would be advantageous if there was a means to identify an input signal with an unknown frequency within a narrow frequency range (band), for the purpose PLL/CDR frequency acquisition applications.

SUMMARY OF THE INVENTION

Disclosed herein is a window sampling pattern means to efficiently compare the frequency between two clock signals. It enables a deterministic mechanism for phase-locked loop (PLL) convergence with a fast lock time. Unlike complex prior arts methods that require counters with many bits to accomplish frequency comparison, the simplest form of the system disclosed herein can be enabled with only 3 flip flops. The system also reduces the convergence time for a PLL, which is an extremely important requirement in many modern communication devices. The system takes advantage of cycle slipping between the two clocks, making the system 100 times faster than the conventional counter method when the signals being compared are close in frequency. By bounding the search between high frequency and low frequency window samplers, and incrementally stepping across the range of possible frequencies, the frequency band occupied by input signal is quickly determined. By reducing the time and integrated circuit (IC) area devoted to frequency locking and acquisition functions, IC power consumption is minimized.

Accordingly, a method is provided for matching a signal (compClk) with an unknown frequency to a particular frequency band in a multiband communications device. The method accepts a compClk signal having an unknown frequency. A frequency source is selected from a plurality of frequency sources collectively covering a range of frequency bands, and a reference clock is supplied from the selected frequency source. A high frequency window sampler compares the compClk signal with the reference clock. If the frequency of the compClk is greater than the reference clock frequency, the high frequency window sampler supplies a first frequency pattern detector output signal (fpdOut_1). Simultaneously, a low frequency window sampler compares the compClk signal with the reference clock. If the frequency of the compClk is less than the reference clock frequency, the low frequency window sampler supplies a second frequency pattern detector output signal (fpdOut_2). The selected frequency source is compared to fpdOut_1 and fpdOut_2 signals, and a determination is made as to whether the selected frequency source coarsely matches the compClk frequency.

More explicitly, the method iteratively selects adjacent frequency sources from the plurality of frequency sources and makes fpdOut_1 and fpdOut_2 comparisons. For example, the highest band frequency source may be initially selected. If an fpdOut_2 signal is detected, it is an indication that the compClk frequency is lower than the reference clock reference, and the frequency source associated with the fpdOut_2 signal is recorded. Then, a lower band frequency source adjacent the previously selected frequency source is selected. If an fpdOut_1 signal is detected, it is an indication that the compClk frequency is higher than the reference clock. Then the frequency source associated with the fpdOut_1 signal is recorded and the search ends.

Additional details of the above-described method and a window sampling system for comparing a signal with an unknown frequency to a reference clock are provided below.

BRIEF DESCRIPTION OF THE DRAWINGS

FIG. 3 is a diagram depicting some exemplary test windows.

DETAILED DESCRIPTION

Figure 1:
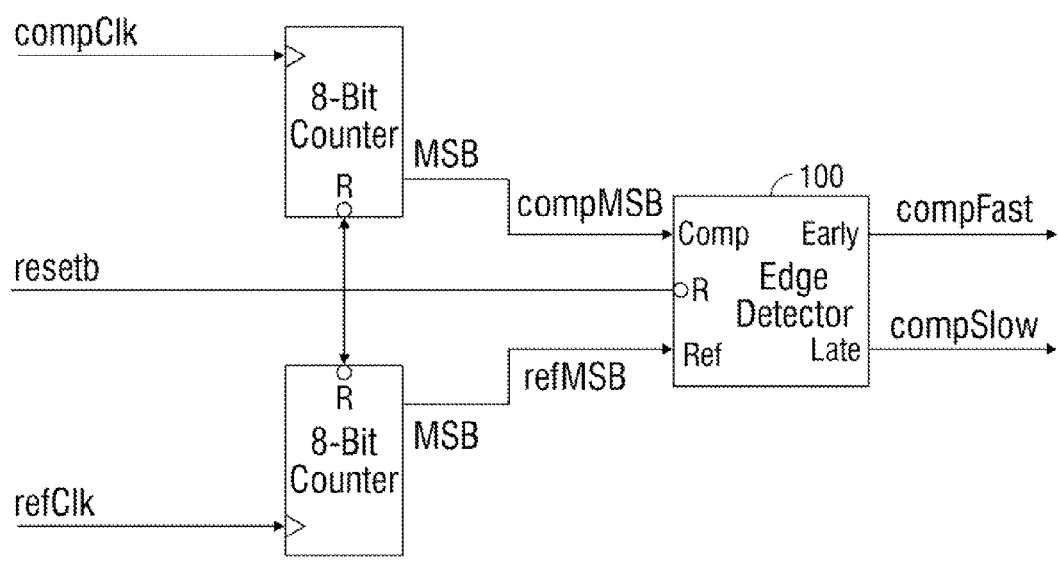
FIG. 1 is a schematic block diagram of a frequency counter (prior art).
Figure 2A:
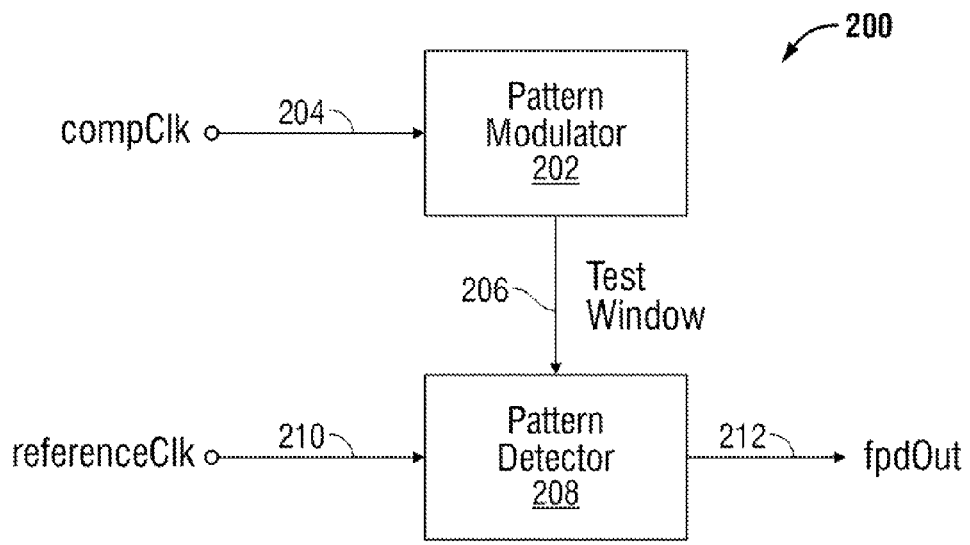
FIGS. 2A and 2B are schematic block diagrams of a window sampling system for comparing a signal with an unknown frequency to a reference clock.
Figure 2B:
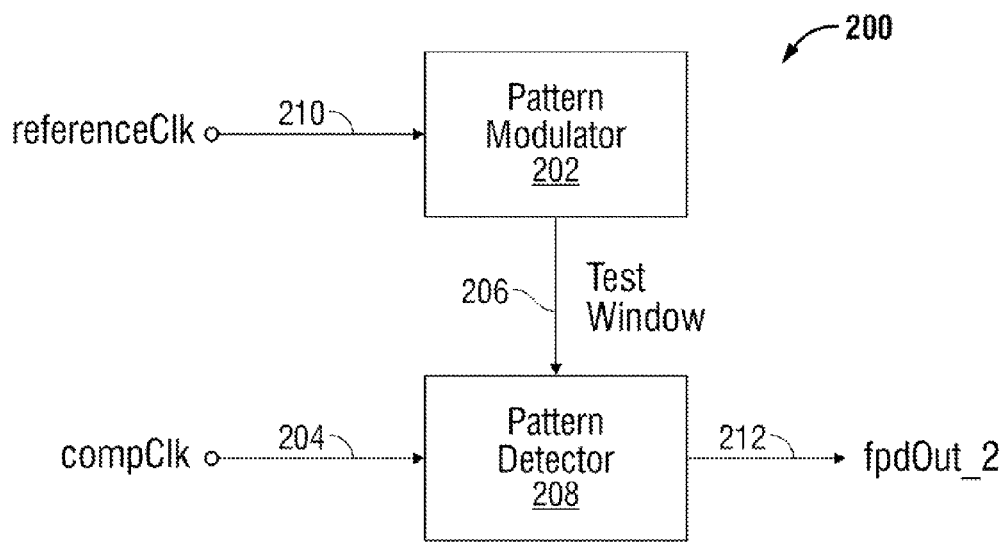

FIGS. 2A and 2B are schematic block diagrams of a window sampling system for comparing a signal with an unknown frequency to a reference clock. The system 200 of FIG. 2A comprises a pattern modulator 202 having an input on line 204 to accept a compClk signal and an output on line 206 to supply a test window. The test window has a period equal to n compClk periods, where n is an integer greater than 1. A pattern detector 208 has an input on line 206 to accept the test window and an input on line 210 to accept a reference clock. The pattern detector 208 contrasts the test window with the reference clock. In response to failing to fit n reference clock periods inside the test window, the pattern detector 208 supplies a frequency pattern detector output signal (fpdOut) on line 212 indicating that the frequency of the compClk is greater than the reference clock frequency.

In one aspect, the pattern modulator 202 supplies a test window having a duty cycle with a first polarity (K) of p compClk periods and with a second polarity (B) of x consecutive compClk periods, where x+p=n, as follows:

(K1 ... Kp, B1 ... Bx).

This pattern means that there are p consecutive K modulation periods followed by x consecutive B modulation periods.

Alternately, the test window may be defined with the following notation:

{Ki, Bj}, where i varies from 1 to p, and j varies from 1 to x.

FIG. 3 is a diagram depicting some exemplary, test windows. Test window A is created by setting p=1 and x=1 (n=2), creating the pattern (K1, B1)=(1, 0). Test window B is created by setting p=1 and x=3 (n=4), creating the pattern (K1, B1, B2, B3)=(1, 0, 0, 0). In this example, the K polarity is associated with the high portion of the duty cycle and B is associated with the low portion. However, the high and low polarities may be associated with B and K, respectively, and the order of polarity within the duty cycle may be reversed.

Returning to FIG. 2A, the pattern detector contrasts the test window with the reference clock by sampling the polarity of modulations within the test window with the reference clock. In response to detecting a pattern of (K1 ... K$_{(<zp)}$) or (B1 ... B$_{(<zx)}$), where z is equal to the number of reference clock sampling edges, a fpdOut signal is supplied indicating that the frequency of the compClk is greater than the reference clock frequency. The test window may be sampled with the reference clock rising or falling edge (z=1), or with both edges (z=2).

Alternately, the pattern (K1 ... K$_{(<zp)}$) may be represented as follows:

{Ki}, where i varies from 1 to less than zp.

In the case where zp=1, no K modulation periods are sampled. In other words, i=0.

Likewise, the pattern (B1 ... B$_{(<zx)}$) may be represented as follows:

{Bj}, where j varies from 1 to less than zx. In the case where zx=1, no B modulation periods are sampled. In other words, j=0.

The pattern (K1 ... K$_{(<zp)}$) represents the case where at least a portion of the K cycle of the test window fails to be sampled. If the compClk frequency is close to the reference clock frequency, the B cycle of the test window (B1 ... Bzx) may be fully sampled, even if the K modulation periods are not completely sampled. If the compClk is much faster, the B cycle may or may not be fully sampled.

Likewise, the pattern (B1 ... B$_{(<zx)}$) represents the case where at least a portion of the B cycle of the test window fails to be sampled. If the compClk frequency is close to the reference clock frequency, the K cycle of the test window (K1 ... Kzp) may be fully sampled, even if the B modulation periods are not completely sampled. In the compClk is much faster, the K cycle may or may not be fully sampled.

It should be understood that if the reference clock is supplied to the pattern modulator on line 210, and the compClk (with an unknown frequency) is supplied to the pattern detector on line 204, the system can be used to determine if the compClk frequency is less than the reference clock frequency, see FIG. 2B.

Figure 4:
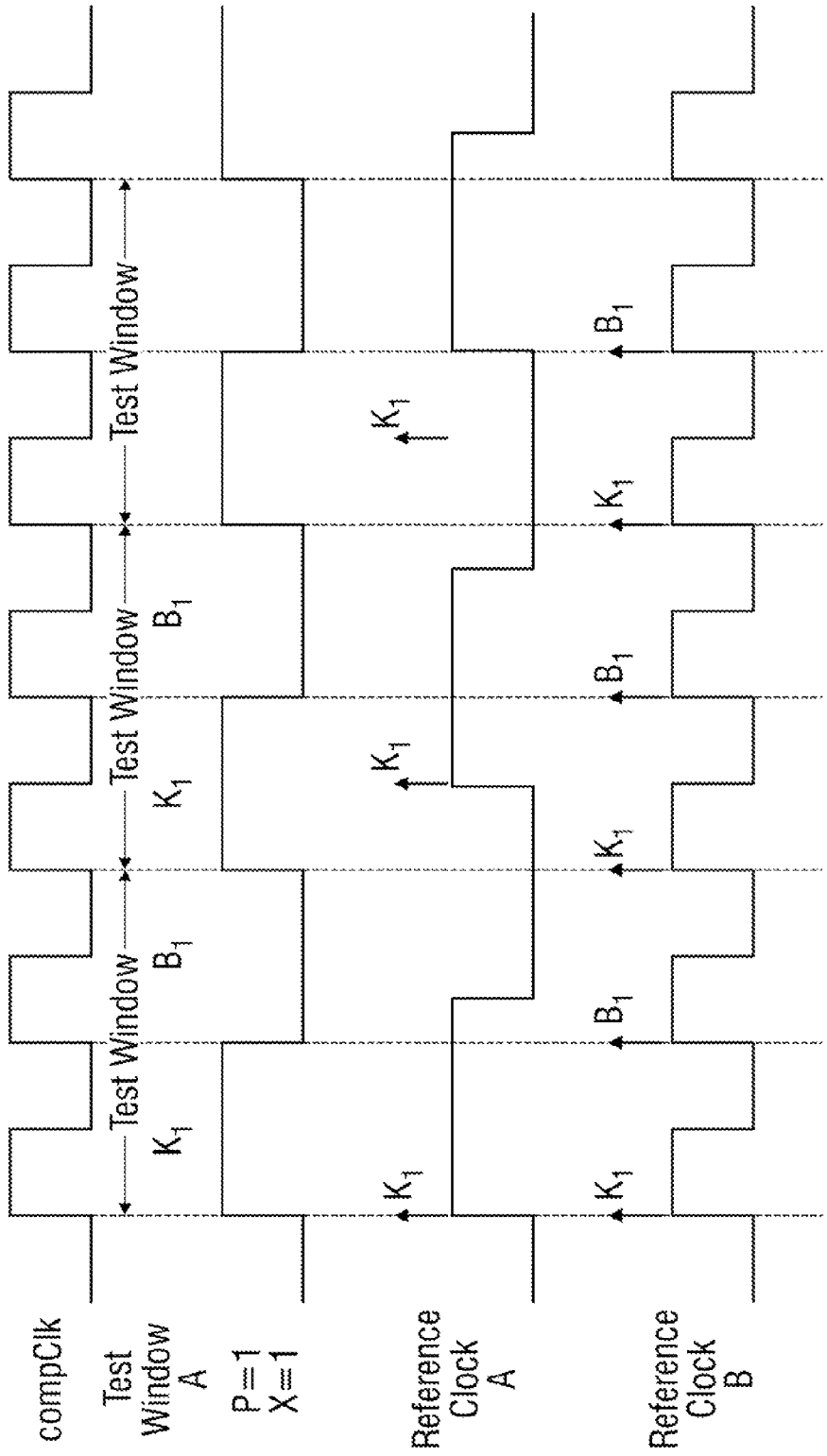
FIG. 4 is a diagram depicting some sampling examples where the compClk frequency is faster than the reference clock.

FIG. 4 is a diagram depicting some sampling examples where the compClk frequency is faster than the reference clock. As in FIG. 3, test window A is creating by setting p=1 and x=1 (n=2), creating the pattern (K1, B1)=(1, 0). The compClk frequency is significantly faster than the frequency of reference clock A, and 3 consecutive patterns of (B1 ... B$_{(zx-1)}$)=(B0) are shown. Since z=1 and x=1, this represents a pattern where the B cycle fails to be sampled in three consecutive test windows. Alternately stated, only the K cycle of the test window (K1) is sampled in the three test windows.

Reference clock B has a frequency equal to the compClk frequency, so that the non-varying pattern of (K1 ... Kzp, B1 ... Bzx) is shown. Since p=1 and x=1, the pattern can also be represented as (K1, B1) in this example.

Figure 5:
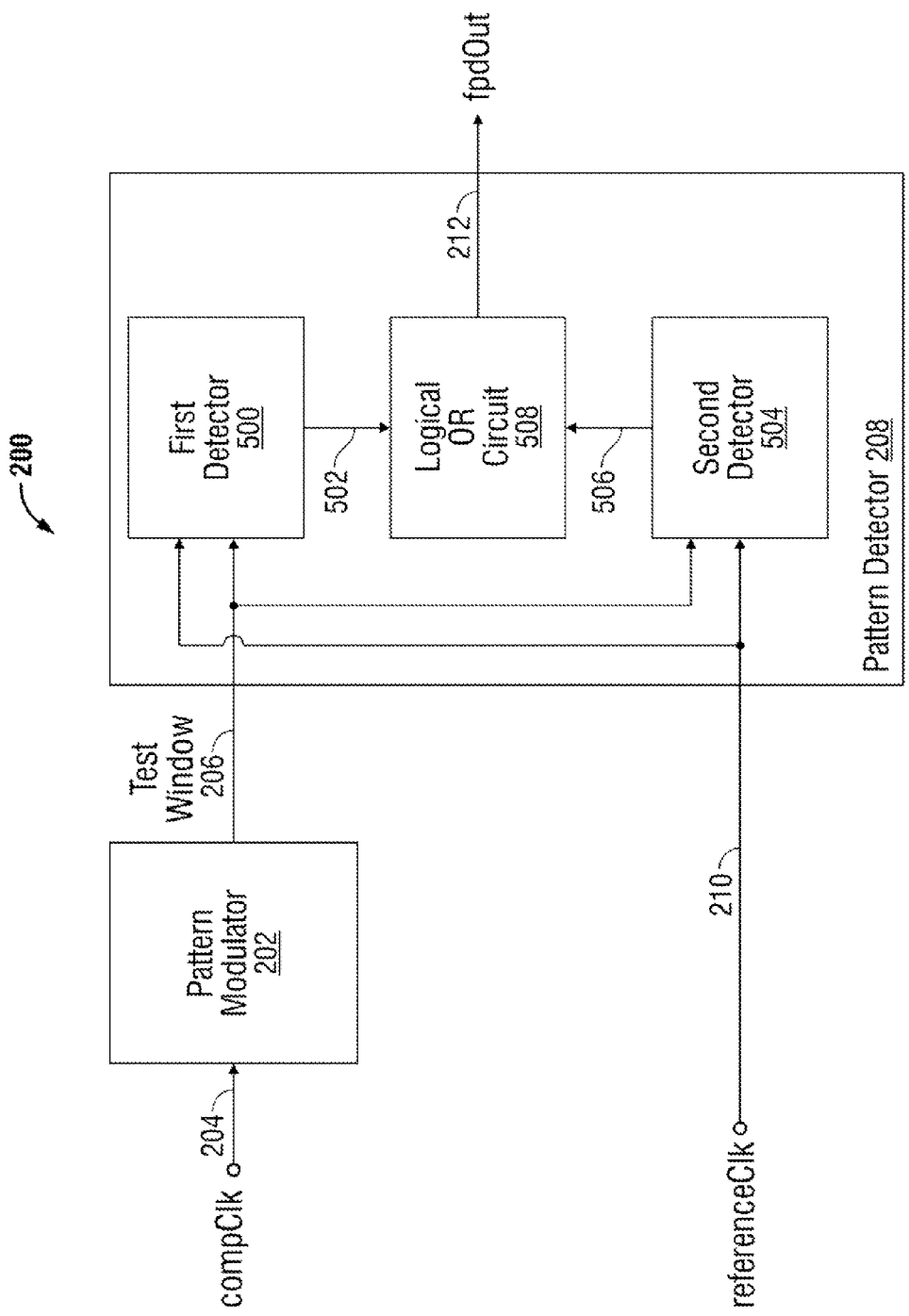
FIG. 5 is a schematic block diagram depicting a first variation of the window sampling system of FIG. 2A.

FIG. 5 is a schematic block diagram depicting a first variation of the window sampling system of FIG. 2A. In this aspect, pattern detector 208 includes a first detector 500 having an input to accept the test window on 206 and an input on line 210 to accept the reference clock. The first detector 500 samples the polarity of modulation within the test window with an edge of the reference clock with either the rising edge or the falling edge, and in response to detecting the pattern (K1 ... K$_{(\leq zp)}$), supplies a first detector signal on line 502.

A second detector 504 has an input on line 206 to accept the test window and an input on line 210 to accept the reference clock. The second detector 504 samples the polarity of modulation within the test window with one edge of the reference clock, and in response to detecting the pattern (B1 ... B$_{(\leq zx)}$), supplies a second detector signal on line 506. A logical OR circuit 508 has inputs on lines 502 and 506 to accept the first and second detector signals, respectively, and an output on line 212 to supply the fpdOut signal.

Figure 6:
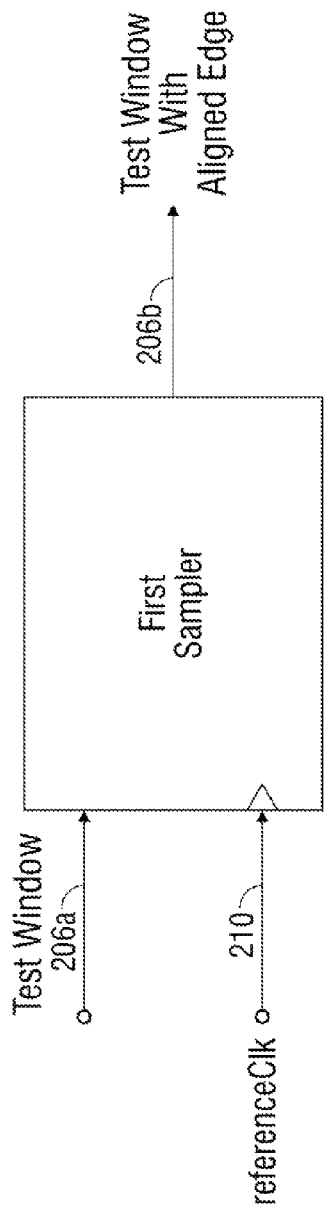
FIG. 6 is a schematic block diagram depicting a second variation of the window sampling system of FIG. 2A.

FIG. 6 is a schematic block diagram depicting a second variation of the window sampling system of FIG. 2A. In this aspect a first sampler circuit 600 has a signal input on line 206a to accept the test window and a clock input on line 210 to accept the reference clock. The sampler circuit 600 samples the polarity of modulation of the test window with the reference clock rising edge and/or falling edge, and supplies a test window to the pattern detector on line 206b having a an edge aligned with a reference clock edge. In one aspect, the first sampler 600 can be enabled using a latch or flip flop. Note: the first sampler can be implemented with the systems depicted in FIGS. 2A, 5, and 7.

Figure 7:
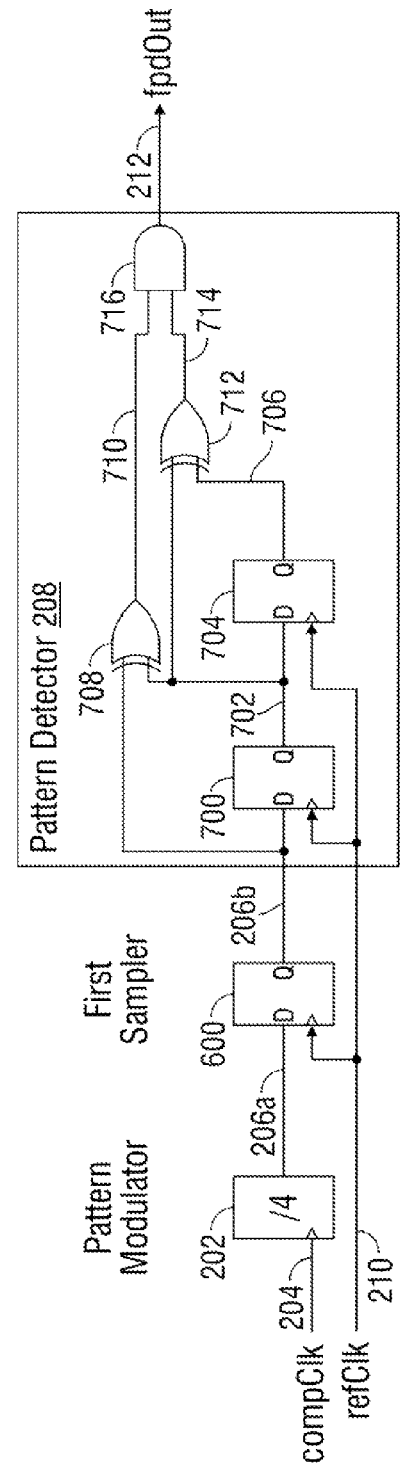
FIG. 7 is a schematic block diagram depicting a third variation of the window sampling system of FIG. 2A.
Figure 8:
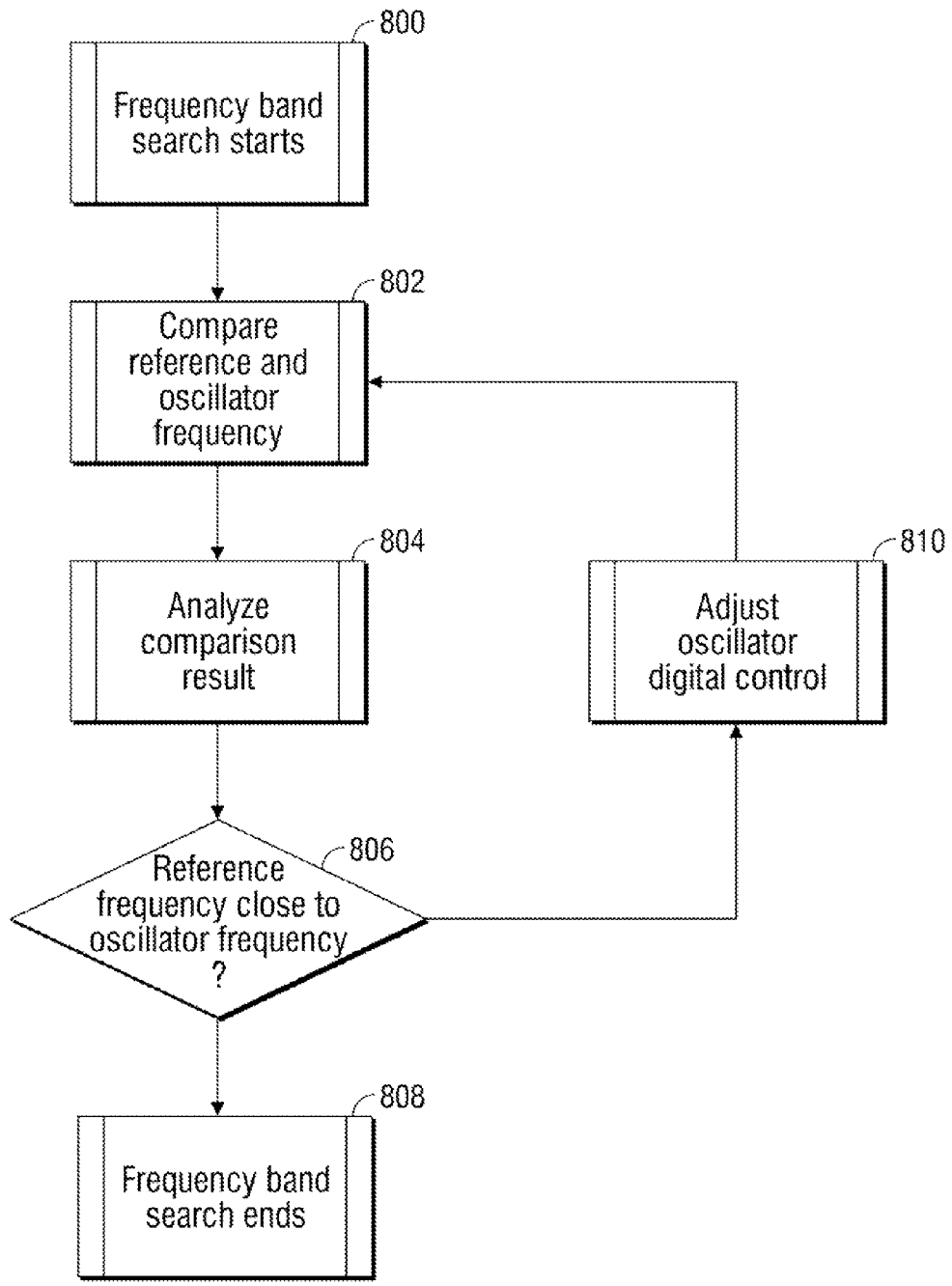
FIG. 8 is a flowchart illustrating a process for acquiring a frequency band in a multi-band communication system (prior art).

FIG. 7 is a schematic block diagram depicting a third variation of the window sampling system of FIG. 2A. In this aspect, the pattern modulator uses values of p=2 and x=2 (n=4). The pattern detector 208 includes a second sampling circuit 700 having a signal input on line 206 to accept the test window and a clock input on line 210 to accept the reference clock. The second sampling circuit 700 samples the polarity of modulation within the test window with one edge (rising or falling) of the reference clock and supplies a first signal at an output on line 702. If the first sampler 600 is used, as shown, the second sampling circuit 700 and first sampler must sample the test window with a common edge of the reference clock.

A third sampling circuit 704 has a signal input on line 702 to accept the first signal and a clock input on line 210 to accept the reference clock. The third sampling circuit 704 samples the polarity of the first signal with one edge of the reference clock, and supplies a second signal at an output on line 706. The third sampling circuit 704 and first sampler 600 must sample the test window with a common edge of the reference clock.

A first exclusive-OR (XOR) gate 708 has inputs on lines 206 and 702 to accept the test window and the first signal, respectively, and an output on line 710 to supply a third signal. A second XOR gate 712 has inputs on lines 702 and 706 to accept the first and second signals, respectively, and an output on line 714 to supply a fourth signal. An AND gate 716 has inputs on lines 710 and 714 to accept the third and fourth signals, respectively, and an output on line 212 to supply the fpdOut signal. Note: the first sampler 600 is shown in this example, but it is not required.

Pattern detector 208 of FIG. 7 may be understood to be a 101/010 pattern detector, as either the pattern 101 or the pattern 010 will cause a pulse on the fpdOut line. The pattern 101 corresponds to the pattern ( ... K2, B1, K1 ... ) or (B1 ... B$_{(\leq zx)}$)=(B1), where z=1 and x=2. The pattern 010 corresponds to the pattern ( ... B2, K1, B1 ... ) or (K1 ... K$_{(\leq zp)}$)=(K1), where z=1 and p=2.

Alternately stated, a non-varying detection of the pattern (1, 1, 0, 0) indicates that the reference clock frequency is equal to the compClk, but a pattern of (K1, B1, B2)=(1, 0, 0), which corresponds to a detected pattern of 010, indicates that the compClk frequency is faster because the K cycle of the test window is only sampled once. A pattern of (K1, K2, B1)=(1, 1, 0), which corresponds to a detected pattern of 101, indicates that the compClk frequency is faster because the B cycle of the test window is only sampled once.

Figure 9:
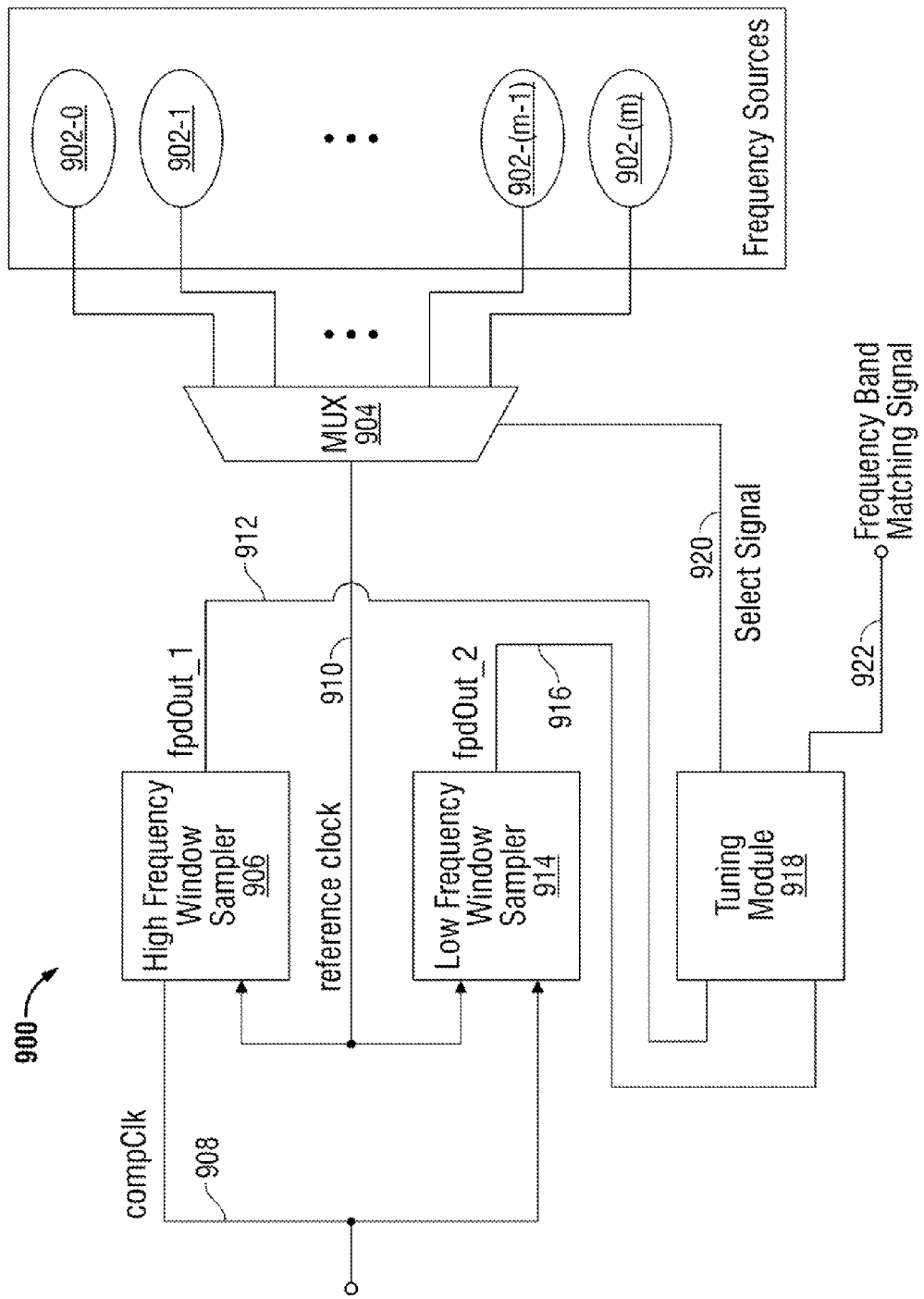
FIG. 9 is a schematic block diagram of a multiband communications device with a system for matching a signal (compClk) with an unknown frequency to a particular frequency band.

FIG. 9 is a schematic block diagram of a multiband communications device with a system for matching a signal (compClk) with an unknown frequency to a particular frequency band. The system 900 comprises a plurality of selectable frequency sources 902 collectively covering a range of frequency bands, where each frequency source supplies a reference clock within a corresponding frequency band. Shown are frequency sources 902-0 through 902-m, where m is an integer variable not limited to any particular value. A multiplexer (MUX) 904 is shown as the frequency band selector, but the system can be enabled using other means known in the art. In one aspect, the frequency source may be a voltage controlled oscillator (VCO) that supplies a reference clock with a frequency about in the middle of its frequency range.

It should be understood that the range of frequencies associated which each VCO may vary in response to fabrication processes, and variations in voltage and temperature, often referred to as Process, Voltage, Temperature (PVT) changes. Therefore, a real-time search of the frequency ranges may be necessary to compensate for PVT change.

A high frequency (HF) window sampler 906 has an input on line 908 to accept a compClk signal with an unknown frequency, and input on line 910 to accept a reference clock from a selected frequency source. Due to PVT changes, the exact frequency of the reference clock may not be known. The high frequency window sampler has an output on line 912 to supply a first frequency pattern detector output signal (fpdOut_1) indicating that the frequency of the compClk is greater than the reference clock frequency. The high frequency window sampler may be enabled using any of the designs described above in the explanation of FIGS. 2A, 5, 6, or 7.

Using the system of FIG. 2A as an example, the high frequency window sampler may includes a pattern modulator 202 having an input on line 204 to accept the compClk signal and an output on line 206 to supply a test window with a period equal to n compClk periods, where n is an integer greater than 1. A pattern detector 208 has an input on line 206 to accept the test window and an input on line 210 to accept the reference clock. The pattern detector 208 contrasts the test window with the reference clock, and in response to failing to fit n reference clock periods inside the test window, supplies the fpdOut (fpdOut_1) signal. The fpdOut_1 signal indicates that frequency of the compClk is greater than the reference clock frequency.

Returning to FIG. 9, a low frequency window sampler 914 has an input on line 908 to accept the compClk signal, and input on line 910 to accept the reference clock. The low frequency window sampler 914 has an output on line 916 to supply a second frequency pattern detector output signal (fpdOut_2) indicating that the frequency of the compClk is less than the reference clock frequency. The low frequency window sampler may be enabled using any of the designs described above in the explanation of FIGS. 2B, 5, 6, or 7, by reversing the compClk and refClk connections.

Taking the system of FIG. 2B as an example, the low frequency window sampler may be enabled with the pattern modulator 202 having an input on line 210 to accept the reference clock and an output on line 206 to supply a test window with a period equal to n reference clock periods, where n is an integer greater than 1. In contrast to the system of FIG. 2A, the reference clock is supplied to the pattern modulator and the compClk is supplied to the pattern detector. The pattern detector 208 has an input to accept the test window on line 206 and an input on line 204 to accept the compClk signal. The pattern detector contrasts the test window with the compClk signal, and in response to failing to fit n compClk periods inside the test window, supplies the fpdOut_2 signal on line 212, indicating that the frequency of the compClk is lower than the reference clock frequency. Note: since the compClk and reference clock signals are reversed from the high frequency window sampler, the fpdOut_2 indicates the opposite polarity of compClk with respect to the reference clock.

Returning to FIG. 9, a tuning module 918 has an output on line 920 to select a frequency source, and inputs on lines 912 and 916 to accept, respectively, the fpdOut_1 and fpdOut_2 signals. The tuning module 918 determines if the compClk frequency coarsely matches the reference clock frequency of a selected frequency source and supplies a frequency band matching signal at an output on line 922 in response to determining the coarse match. In one aspect, the frequency band matching signal initiates a frequency acquisition and tracking process.

The tuning module 918 determines the coarse match between the compClk frequency on line 908 and the reference clock frequency on line 910 by iteratively selecting adjacent frequency sources 902 from the plurality of frequency sources. For example, the tuning module 918 may determines the coarse match between the compClk frequency and the reference clock frequency by initially selecting the highest band frequency source (e.g., 902-0). If an fpdOut_2 signal is detected on line 916, indicating that the compClk frequency is lower than the reference clock reference, the tuning module 918 records the frequency source associated with the fpdOut_2 signal and selects a lower band frequency source (e.g., 902-1) adjacent the previously selected frequency source (902-0). If an fpdOut_1 signal is detected on line 912, indicating that the compClk frequency is higher than the reference clock, the tuning module 912 records the frequency source associated with the fpdOut_1 signal and ends the search.

A typical search may include the iterative selection of several incrementally lower frequency sources before the fdpOut_1 signal is detected. Once the fpdOut_1 is detected, the tuning module 918 accesses the identity of a first frequency band associated with the last recorded fpdOut_2 signal. The tuning module 918 also accesses the identity of a second frequency band associated with the recorded fpdOut_1 signal. Then, the tuning module selects a frequency band about midway between the first and second frequency bands, and sends the frequency band matching signal on line 922. Note: the tuning module 918 may select either the first or second frequency bands if the first frequency band is adjacent the second frequency band, as either band is likely to be closer in frequency to the compClk signal.

Alternately, the tuning module 918 determines the coarse match between the compClk frequency and the reference clock frequency by initially selecting a lowest band frequency source (e.g., 902-m). If an fpdOut_1 signal is detected, indicating that the compClk frequency is greater than the reference clock reference, the tuning module records the frequency source associated with the fpdOut_1 signal and selects a higher band frequency source (e.g., 902-(m-1)) adjacent the previously selected frequency source. If an fpdOut_2 signal is detected, indicating that the compClk frequency is lower than the reference clock, the tuning module 918 records the frequency source associated with the fpdOut_2 signal and ends the search.

In a manner similar to the previous example, the tuning module 918 accesses the identity of a first frequency band associated with the last recorded fpdOut_1 signal, and accesses the identity of a second frequency band associated with the recorded fpdOut_2 signal. The tuning module selects a frequency band about midway between the first and second frequency bands, and sends the frequency band matching signal on line 922. The tuning may be implemented as software, firmware, or hardware. As software, the tuning module would be a sequence of instructions stored in a non-transitory memory and executed by a processor. As hardware, the tuning module may be implemented in a dedicated integrated circuit or field programmable gate array (FPGA). High speed applications require a hardware (hardwired logic) implementation. For lower speed, firmware can be used. Otherwise, the tuning module is implemented as software.

Functional Description

Figure 10A:
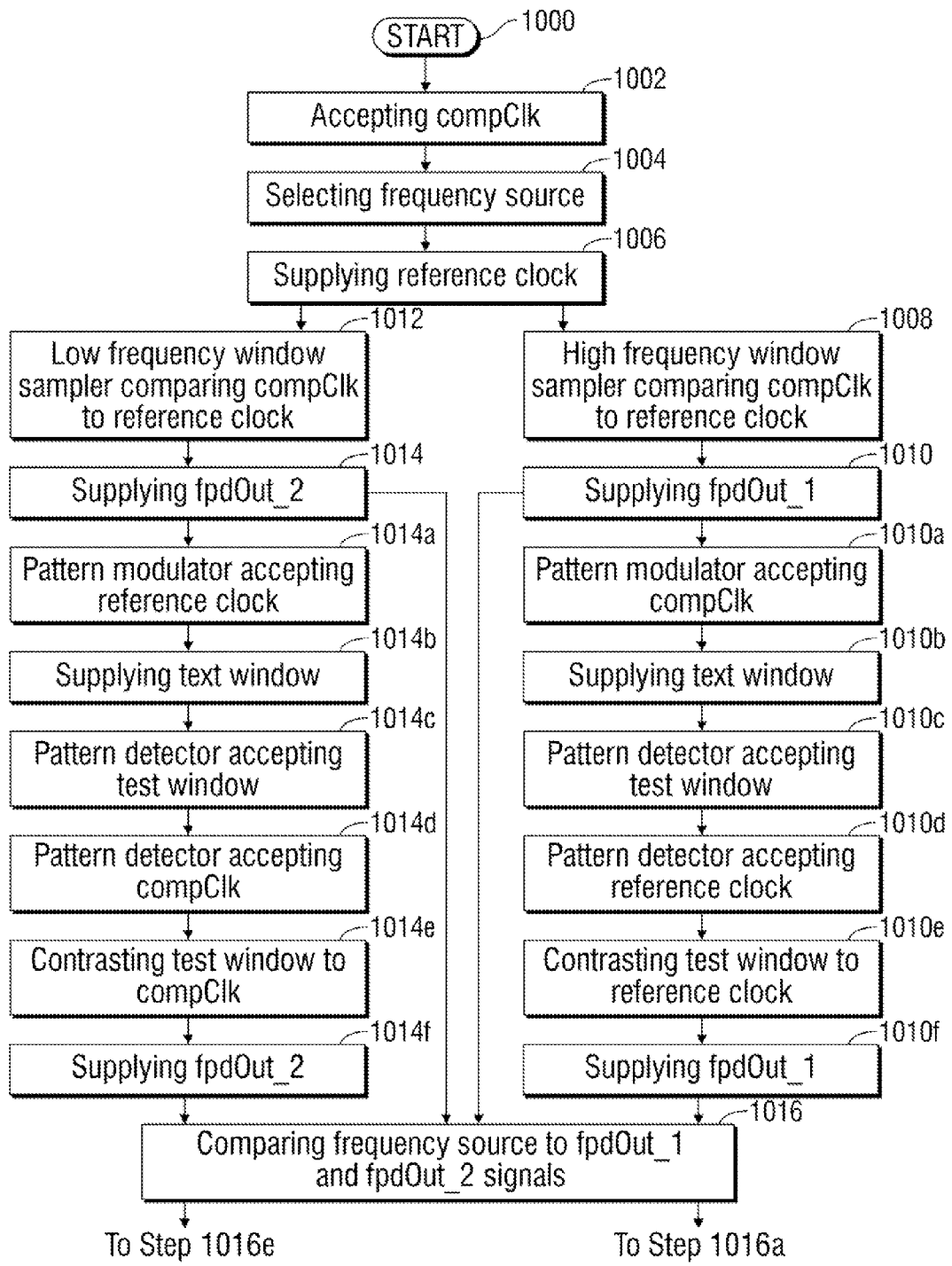
FIGS. 10A and 10B are flowcharts illustrating a method for matching a signal (compClk) with an unknown frequency to a particular frequency band in a multiband communications device.
Figure 10B:
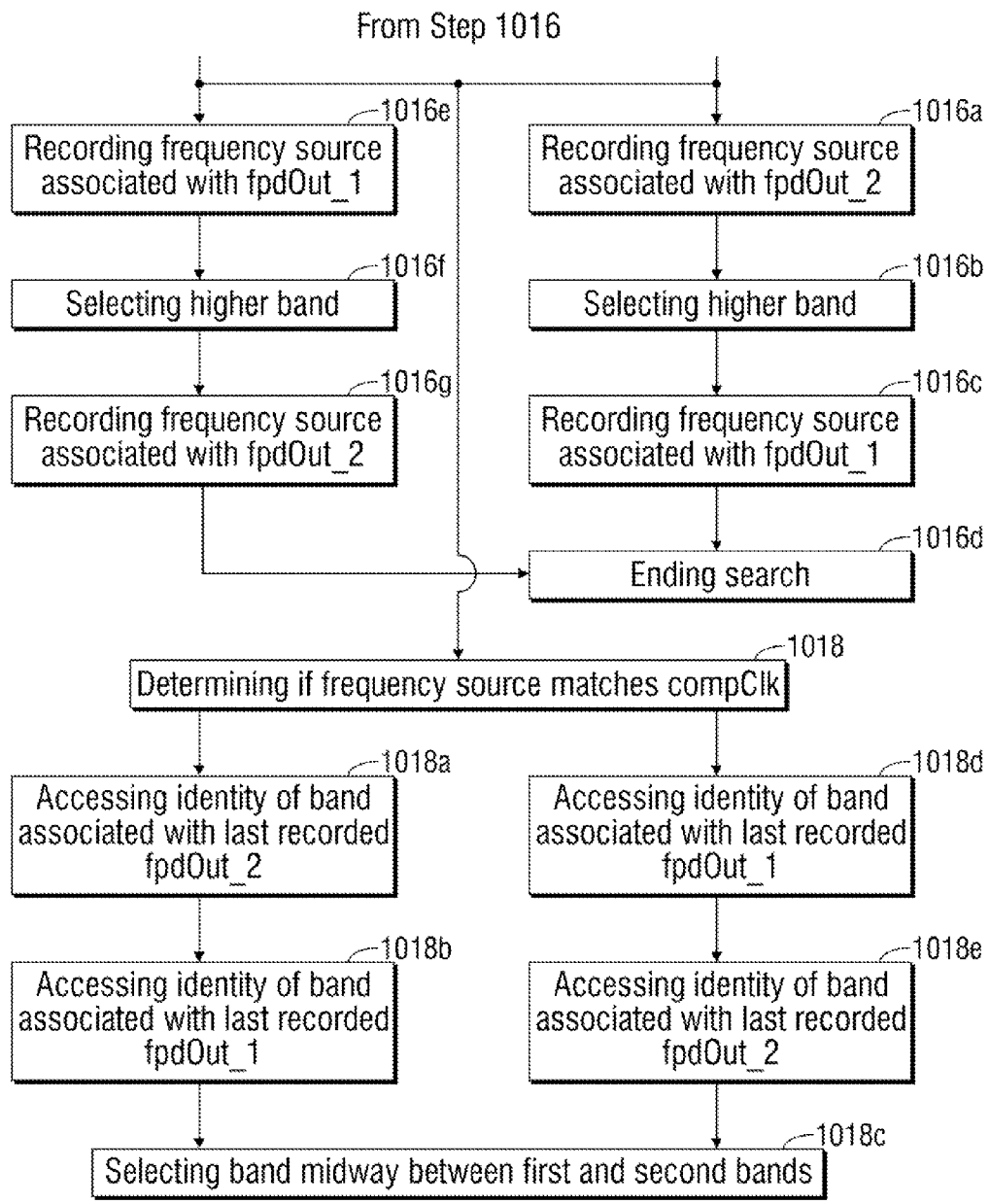

FIGS. 10A and 10B are flowcharts illustrating a method for matching a signal (compClk) with an unknown frequency to a particular frequency band in a multiband communications device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 1000.

Step 1002 accepts a compClk signal having an unknown frequency. Step 1004 selects a frequency source from a plurality of frequency sources collectively covering a range of frequency bands. Step 1006 supplies a reference clock from the selected frequency source. In Step 1008 a high frequency window sampler compares the compClk signal with the reference clock. If the frequency of the compClk is greater than the reference clock frequency, in Step 1010 the high frequency window sampler supplies a first frequency pattern detector output signal (fpdOut_1). In Step 1012 a low frequency window sampler compares the compClk signal with the reference clock. Step 1012 may be performed simultaneously with Step 1008. If the frequency of the compClk is less than the reference clock frequency, in Step 1014 the low frequency window sampler supplies a second frequency pattern detector output signal (fpdOut_2). Step 1016 compares the selected frequency source to fpdOut_1 and fpdOut_2 signals, and Step 1018 determines if the selected frequency source coarsely matches the compClk frequency.

In one aspect, selecting the frequency source in Step 1004 includes iteratively selecting adjacent frequency sources from the plurality of frequency sources. For example, Step 1004 may initially select the highest band frequency source. Then, comparing the selected frequency source to the fpdOut_1 and fpdOut_2 signals in Step 1016 includes substeps. If an fpdOut_2 signal is detected, indicating that the compClk frequency is lower than the reference clock reference, Step 1016a records the frequency source associated with the fpdOut_2 signal, and Step 1016b selects a lower band frequency source adjacent the previously selected frequency source. If an fpdOut_1 signal is detected, indicating that the compClk frequency is higher than the reference clock, Step 1016c records the frequency source associated with the fpdOut_1 signal, and Step 1016d ends the search.

Determining if the selected frequency source coarsely matches the compClk frequency in Step 1018 may include the following substeps. Step 1018a accesses the identity of a first frequency band associated with the last recorded fpdOut_2 signal. Step 1018b accesses the identity of a second frequency band associated with the recorded fpdOut_1 signal. Step 1018c selects a frequency band about midway between the first and second frequency bands. In one aspect, selecting the midway frequency band in Step 1018c may include selecting either the first or second frequency bands if the first frequency band is adjacent the second frequency band.

Alternately, Step 1004 may initially select the lowest band frequency source. Then, comparing the selected frequency source to the fpdOut_1 and fpdOut_2 signals may include the following substeps. If an fpdOut_1 signal is detected, indicating that the compClk frequency is greater than the reference clock reference, Step 1016e records the frequency source associated with the fpdOut_1 signal. Step 1016f selects a higher band frequency source adjacent the previously selected frequency source. If an fpdOut_2 signal is detected, indicating that the compClk frequency is lower than the reference clock, Step 1016g records the frequency source associated with the fpdOut_2 signal, and Step 1016d ends the search.

Then, determining if the selected frequency source coarsely matches the compClk frequency may include the following substeps. Step 1018d accesses the identity of a first frequency band associated with the last recorded fpdOut_1 signal. Step 1018e accesses the identity of a second frequency band associated with the recorded fpdOut_2 signal. Step 1018c selects a frequency band about midway between the first and second frequency bands.

In another aspect, the high frequency window sampler supplying fpdOut_1 may perform the follow substeps associated with Step 1010. In Step 1010a a pattern modulator accepts the compClk signal. In Step 1010b the pattern modulator supplies a test window with a period equal to n compClk periods, where n is an integer greater than 1. In Step 1010c a pattern detector accepts the test window. In Step 1010d the pattern detector accepts the reference clock. In Step 1010e the pattern detector contrasts the test window with the reference clock. In response to failing to fit n reference clock periods inside the test window, Step 1010f supplies the fpdOut_1 signal indicating that the frequency of the compClk is greater than the reference clock frequency.

The low frequency window sampler supplying fpdOut_2 may perform the following substeps associated with Step 1014. In Step 1014a a pattern modulator accepts the reference clock. In Step 1014b the pattern modulator supplies a test window with a period equal to n reference clock periods, where n is an integer greater than 1. In Step 1014c a pattern detector accepts the test window. In Step 1014d the pattern detector accepts the compClk signal. In Step 1014e the pattern detector contrasts the test window with the compClk. In response to failing to fit n compClk periods inside the test window, Step 1014f supplies the fpdOut_2 signal indicating that the frequency of the compClk is lower than the reference clock frequency.

Figure 11:
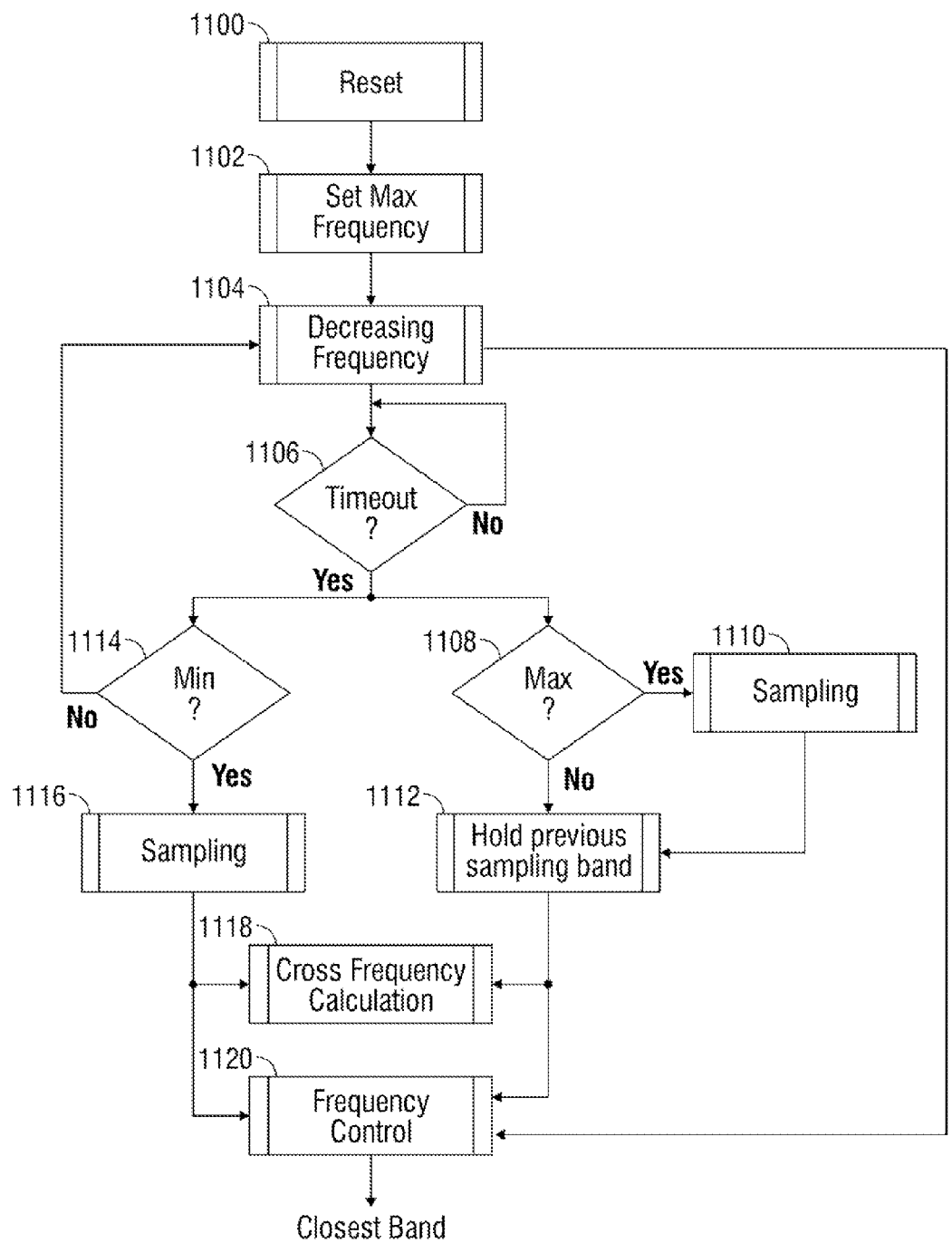
FIG. 11 is a flowchart depicting an alternate aspect of the method for matching the compClk signal to a particular frequency band.

FIG. 11 is a flowchart depicting an alternate aspect of the method for matching the compClk signal to a particular frequency band. The method begins with a reset in Step 1100. In Step 1102 the maximum frequency band algorithm is selected. In Step 1104 the reference clock from the initial frequency band is supplied. A sufficient measurement time is allocated in Step 1106. If fpdOut_2 is detected in Step 1114, the band is recorded in Step 1116. If fpdOut_2 is not detected, the method returns to Step 1104 where the frequency band is decremented. If fpdOut_1 is detected in Step 1108, the band is recorded in Step 1110, and the band is held in Step 1112. Step 1118 analyzes the recorded band cross-referenced to the fpdOut_1 and fpdOut_2 signals, and the closest band to the input signal is selected in Step 1120.

A system and method have been provided for matching an unknown frequency to a particular frequency band using a window sampling method. Particular circuits and process steps have been used to illustrate the invention, but the invention is not necessarily limited to these examples. Other variations and embodiments of the invention will occur to those skilled in the art.

We claim:

1. A multiband communications device with a system for matching a signal (compClk) with an unknown frequency to a particular frequency band, the system comprising:
   a plurality of selectable frequency sources collectively covering a range of frequency bands, where each frequency source supplies a reference clock within a corresponding frequency band;
   a high frequency window sampler having an input to accept a compClk signal with an unknown frequency, and input to accept a reference clock from a selected frequency source, and an output to supply a first frequency pattern detector output signal (fpdOut_1) indicating that the frequency of the compClk is greater than the reference clock frequency;
   a low frequency window sampler having an input to accept the compClk signal, and input to accept the reference clock, and an output to supply a second frequency pattern detector output signal (fpdOut_2) indicating that the frequency of the compClk is less than the reference clock frequency; and,
   a tuning module having an output to select a frequency source, and inputs to accept the fpdOut_1 and fpdOut_2 signals, the tuning module determining if the compClk frequency coarsely matches the reference clock frequency of a selected frequency source and supplying a frequency band matching signal at an output in response to determining the coarse match.

2. The system of claim 1 wherein the tuning module determines the coarse match between the compClk frequency and the reference clock frequency by iteratively selecting adjacent frequency sources from the plurality of frequency sources.

3. The system of claim 2 wherein the tuning module determines the coarse match between the compClk frequency and the reference clock frequency as follows:
   selecting a highest band frequency source;
   if an fpdOut_2 signal is detected, indicating that the compClk frequency is lower than the reference clock reference, recording the frequency source associated with the fpdOut_2 signal and selecting a lower band frequency source adjacent the previously selected frequency source; and,
   if an fpdOut_1 signal is detected, indicating that the compClk frequency is higher than the reference clock, recording the frequency source associated with the fpdOut_1 signal and ending the search.

4. The system of claim 3 wherein the tuning module determines the coarse match between the compClk frequency and the reference clock frequency as follows:
   accessing the identity of a first frequency band associated with the last recorded fpdOut_2 signal;
   accessing the identity of a second frequency band associated with the recorded fpdOut_1 signal; and,
   selecting a frequency band about midway between the first and second frequency bands.

5. The system of claim 4 wherein the tuning module selects a frequency band from a group consisting of the first and second frequency bands if the first frequency band is adjacent the second frequency band.

6. The system of claim 2 wherein the tuning module determines the coarse match between the compClk frequency and the reference clock frequency as follows:
   selecting a lowest band frequency source;
   if an fpdOut_1 signal is detected, indicating that the compClk frequency is greater than the reference clock reference, recording the frequency source associated with the fpdOut_1 signal and selecting a higher band frequency source adjacent the previously selected frequency source; and,
   if an fpdOut_2 signal is detected, indicating that the compClk frequency is lower than the reference clock, recording the frequency source associated with the fpdOut_2 signal and ending the search.

7. The system of claim 6 wherein the tuning module determines the coarse match between the compClk frequency and the reference clock frequency as follows:
   accessing the identity of a first frequency band associated with the last recorded fpdOut_1 signal;
   accessing the identity of a second frequency band associated with the recorded fpdOut_2 signal; and,
   selecting a frequency band about midway between the first and second frequency bands.

8. The system of claim 1 wherein the high frequency window sampler includes:
   a pattern modulator having an input to accept the compClk signal and an output to supply a test window with a period equal to n compClk periods, where n is an integer greater than 1; and,
   a pattern detector having an input to accept the test window and an input to accept the reference clock, the pattern detector contrasting the test window with the reference clock, and in response to failing to fit n reference clock periods inside the test window, supplying the fpdOut_1 signal indicating that the frequency of the compClk is greater than the reference clock frequency.

9. The system of claim 1 wherein the low frequency window sampler includes:
   a pattern modulator having an input to accept the reference clock and an output to supply a test window with a period equal to n reference clock periods, where n is an integer greater than 1; and,
   a pattern detector having an input to accept the test window and an input to accept the compClk signal, the pattern detector contrasting the test window with the compClk signal, and in response to failing to fit n compClk periods inside the test window, supplying the fpdOut_2 signal indicating that the frequency of the compClk is lower than the reference clock frequency.

10. In a multiband communications device, a method for matching a signal (compClk) with an unknown frequency to a particular frequency band, the method comprising:
   accepting a compClk signal having an unknown frequency;
   selecting a frequency source from a plurality of frequency sources collectively covering a range of frequency bands;
   supplying a reference clock from the selected frequency source;
   a high frequency window sampler comparing the compClk signal with the reference clock;
   if the frequency of the compClk is greater than the reference clock frequency, the high frequency window sampler supplying a first frequency pattern detector output signal (fpdOut_1);
   a low frequency window sampler comparing the compClk signal with the reference clock;
   if the frequency of the compClk is less than the reference clock frequency, the low frequency window sampler supplying a second frequency pattern detector output signal (fpdOut_2);
   comparing the selected frequency source to fpdOut_1 and fpdOut_2 signals; and,
   determining if the selected frequency source coarsely matches the compClk frequency.

11. The method of claim 10 wherein selecting the frequency source includes iteratively selecting adjacent frequency sources from the plurality of frequency sources.

12. The method of claim 11 wherein selecting the frequency source includes selecting a highest band frequency source;
   wherein comparing the selected frequency source to the fpdOut_1 and fpdOut_2 signals includes:
      if an fpdOut_2 signal is detected, indicating that the compClk frequency is lower than the reference clock reference, recording the frequency source associated with the fpdOut_2 signal; and,
      selecting a lower band frequency source adjacent the previously selected frequency source;
      if an fpdOut_1 signal is detected, indicating that the compClk frequency is higher than the reference clock, recording the frequency source associated with the fpdOut_1 signal; and,
      ending the search.

13. The method of claim 12 wherein determining if the selected frequency source coarsely matches the compClk frequency includes:
   accessing the identity of a first frequency band associated with the last recorded fpdOut_2 signal;
   accessing the identity of a second frequency band associated with the recorded fpdOut_1 signal; and,
   selecting a frequency band about midway between the first and second frequency bands.

14. The method of claim 13 wherein selecting the midway frequency band includes selecting a frequency band selected from a group consisting of the first and second frequency bands if the first frequency band is adjacent the second frequency band.

15. The method of claim 11 wherein selecting the frequency source includes selecting a lowest band frequency source;
   wherein comparing the selected frequency source to the fpdOut_1 and fpdOut_2 signals includes:
      if an fpdOut_1 signal is detected, indicating that the compClk frequency is greater than the reference clock reference, recording the frequency source associated with the fpdOut_1 signal; and,
      selecting a higher band frequency source adjacent the previously selected frequency source;
      if an fpdOut_2 signal is detected, indicating that the compClk frequency is lower than the reference clock, recording the frequency source associated with the fpdOut_2 signal; and,
      ending the search.

16. The method of claim 15 wherein determining if the selected frequency source coarsely matches the compClk frequency includes:

accessing the identity of a first frequency band associated with the last recorded fpdOut_1 signal;

accessing the identity of a second frequency band associated with the recorded fpdOut_2 signal; and, selecting a frequency band about midway between the first and second frequency bands.

17. The method of claim 10 wherein the high frequency window sampler supplying fpdOut_1 if the frequency of the compClk is greater than the reference clock frequency includes:

a pattern modulator accepting the compClk signal;

the pattern modulator supplying a test window with a period equal to n compClk periods, where n is an integer greater than 1;

a pattern detector accepting the test window;

the pattern detector accepting the reference clock;

the pattern detector contrasting the test window with the reference clock; and, in response to failing to fit n reference clock periods inside the test window, supplying the fpdOut_1 signal indicating that the frequency of the compClk is greater than the reference clock frequency.

18. The method of claim 10 wherein the low frequency window sampler supplying fpdOut_2 if the frequency of the compClk is lower than the reference clock frequency includes:

a pattern modulator accepting the reference clock;

the pattern modulator supplying a test window with a period equal to n reference clock periods, where n is an integer greater than 1;

a pattern detector accepting the test window;

the pattern detector accepting the compClk signal;

the pattern detector contrasting the test window with the compClk; and, in response to failing to fit n compClk periods inside the test window, supplying the fpdOut_2 signal indicating that the frequency of the compClk is lower than the reference clock frequency.

* * * * *